United States Patent [19]
White

[11] Patent Number: 4,826,365
[45] Date of Patent: May 2, 1989

[54] MATERIAL-WORKING TOOLS AND METHOD FOR LUBRICATING

[75] Inventor: Gerald W. White, Dallas, Tex.

[73] Assignee: White Engineering Corporation, Dallas, Tex.

[21] Appl. No.: 146,268

[22] Filed: Jan. 20, 1988

[51] Int. Cl.$^4$ .................. B23B 51/02; B65H 31/26
[52] U.S. Cl. ................... 408/144; 76/108 T; 269/285; 271/220; 407/119
[58] Field of Search ............ 408/144, 230; 76/108 R, 76/108 T; 407/119; 269/263, 275, 285; 271/220

[56] References Cited

U.S. PATENT DOCUMENTS

| | | | |
|---|---|---|---|
| Re. 30,401 | 9/1980 | White | 204/192 N |
| 684,142 | 10/1901 | Ward | 269/285 X |
| 2,916,286 | 12/1959 | Keating | 271/220 |
| 3,329,601 | 7/1967 | Mattox | 204/298 |
| 3,806,380 | 4/1974 | Kitada et al. | 148/159 |
| 3,857,682 | 12/1974 | White | 29/195 |
| 3,913,520 | 10/1975 | Berg et al. | 118/7 |
| 3,925,116 | 12/1975 | Engel | 148/143 |
| 3,945,807 | 3/1976 | Fukutome | 408/230 X |
| 3,974,059 | 8/1976 | Murayama | 204/298 |
| 4,016,389 | 4/1977 | White | 219/10.49 |
| 4,039,416 | 8/1977 | White | 204/192 N |
| 4,054,426 | 10/1977 | White | 51/309 R |
| 4,094,764 | 6/1978 | Boucher et al. | 204/298 |
| 4,107,350 | 8/1978 | Berg et al. | 427/38 |
| 4,116,791 | 9/1978 | Zega | 204/192 N |
| 4,181,590 | 1/1980 | Fujishiro et al. | 204/192 N |
| 4,210,701 | 7/1980 | Berg et al. | 428/409 |
| 4,273,325 | 6/1981 | Rodewald | 271/220 |
| 4,342,631 | 8/1982 | White et al. | 204/192 N |
| 4,420,386 | 12/1983 | White | 204/192 N |
| 4,468,309 | 8/1984 | White | 204/192 N |
| 4,484,381 | 11/1984 | Ellis et al. | 269/275 X |

FOREIGN PATENT DOCUMENTS 789015  1/1958  United Kingdom ............... 271/220

*Primary Examiner*—Z. R. Bilinsky
*Attorney, Agent, or Firm*—Ross, Howison, Clapp & Korn

[57] ABSTRACT

A method for lubricating a material-working tool comprises depositing a material film by high energy level vacuum plating onto the tool for providing a thin mechanically insulating film having a low shear stress value. The material film has a hardness which is less than the hardness of the tool which it overlies.

11 Claims, 2 Drawing Sheets

4,826,365

MATERIAL-WORKING TOOLS AND METHOD FOR LUBRICATING

TECHNICAL FIELD

This invention relates to material-working tools and a method for lubricating same, and more particularly to a method for lubricating material-working tools utilizing high energy level ion plating methods.

BACKGROUND OF THE INVENTION

Hardened tools are typically used to work in various modes such as drilling, routing or general machining of a variety of softer materials. For example, tungsten carbide drills are used to drill through the glassy G-10 material of printed circuit boards, and nitrided steel router bits are used for cutting 4140 steel. Although machine shop lubricants are normally employed to assist in the operation of these tools, these lubricants merely serve as coolants since they are readily displaced at the actual cutting interface both physically and thermally. Thus, the outer atomic surface of the cutting tool is in intimate contact with the corresponding atomic surface of the material being cut at the maximum point of application of both stress and temperature. In such operation, without the benefit of any lubricant protection, the maximum opportunity for destruction of the tool occurs.

Lubricity is essential for reasonable life of materials subjected to such severe operational environments. At the elevated temperatures that occur in the tool's outer atomic layers during machining, conditions exist to promote physical as well as chemical deterioration of the tool's working surface. Lubricants in general function by allowing slippage between moving parts by providing shearing action and floating support as long as the lubricant is not thermally destroyed or physically displaced. Even after the lubricant film is penetrated, there is still a measure of protection remaining in the form of metal oxides that may occur on the tool's surface. Once the film is penetrated, however, there is nothing to prevent various failure mechanisms such as cold welding, where the lattice structures of the tool and material being cut actually join by atomic diffusion; burning; or chemical attack from activated reagents present in the material being cut. It is well known that for example, wood, although softer, is damaging to tungsten carbide routers and consumes these routers at an excessive rate. Similarly, diamond cutting tools fail rapidly when machining ferritic alloys by the dissolution of the carbon into the iron being cut following the natural tendency of iron and carbon to form the solid solutions that make the manufacture of steel possible. Likewise, the nickel and cobalt binders use in the manufacture of metal carbide cutting tools are susceptible to similar failure mechanisms. Nickel is extremely soluble in a variety of materials, particularly at the elevated temperatures at the cutting edge. Clearly, there is more to the protection of good cutting edges than hardness alone.

In spite of the foregoing factors, the emphasis on cutting tool development has been almost solely directed to hardness factors alone. Over the years the hardness inherent in metal carbide tools, despite an almost total lack of ductility, resulting in brittleness, has made carbide tools more popular than the softer, albeit more ductile, tools made of heat treated, hardened steel alloys. It has been desireable to improve even the metal carbide tools by using treatments that offer a more continuous, binderless surface of an even harder refractory material such as, for example, titanium nitride. Titanium-nitride films are deposited by chemical vapor deposition, sputtering or reactive ion plating. However, the results of these hard coatings are deficient for various uses.

One of these uses involves the problem of drilling holes in printed circuit boards. This problem is particularly aggravated by the increased demand for multilayered printed circuit boards which are constructed of alternating layers of G-10 (glass webbed material) and metal conductors. During the act of drilling, the glassy material actually flows under melt as the drill bit penetrates the board to the extent that "smearing" of the layers together occurs at the edges of the resulting hole. The need for hole desmearing processes has added extra steps into the process of printed circuit board manufacture and is a problem that has not been alleviated by titanium-nitride films and other refractory material coatings applied to tungsten carbide drill bits. Problems also exist for carbide router bits used in drilling processes. This problem is not that the carbide is softer than the glass that it is drilling since the carbide is in fact much harder, but a combination of surface affinity of the glass for the tool, heat generation and failure of the carbide tool itself. Therefore, a need exists for a lubricant for protecting two surfaces from themselves during high energy sliding contact.

It should be noted that the characteristics that make a lubricant effective include a low ability to wet, and subsequently the ability to bond to the surfaces. Good lubrication implies smooth slippage of one surface over another and will breakdown if the lubricant is displaced. A need thus exists for a material-working tool that possesses such lubricity as well as a method for bonding such lubricant to surfaces of the tool that will assure that the lubricant is not displaced by adhesion failure when the stresses inherent in the tool's operation are experienced.

SUMMARY OF THE INVENTION

In accordance with the present invention, a method for lubricating a material-working tool comprises depositing a material film by high energy level vacuum plating onto the tool for providing a thin mechanically insulating film having a low shear stress value. The material film has a hardness which is less than the hardness of the tool which it overlies.

BRIEF DESCRIPTION OF THE DRAWINGS

For a more complete understanding of the present invention and for further advantages thereof, reference is now made to the following Description taken in conjunction with the accompanying Drawings in which.

DESCRIPTION OF THE PREFERRED EMBODIMENTS

Figure 1:
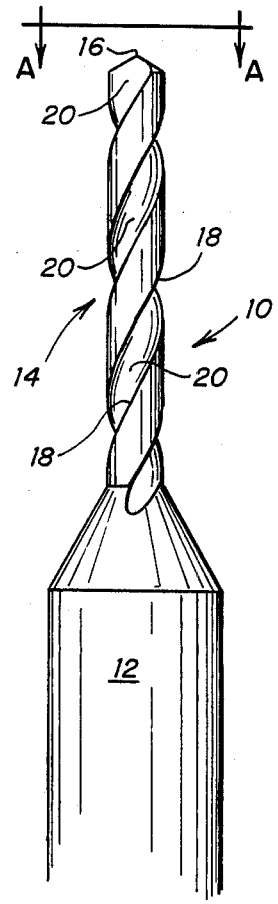
FIG. 1 is a side view of a drill bit lubricated in accordance with the present invention.

Referring to FIG. 1, a material-working tool such as, for example, a drill bit, generally identified by the numeral 10 is illustrated. While the present invention is useful for coating drill bits and paper guides as will subsequently be described with respect to FIG. 6, the present method for lubricating material-working tools is not limited to those tools described herein. The present method is useful for coating various types of material-working tools such as for example, drilling, routing, and general machining tools which are of a hard material that operate or come in contact with softer materials.

Drill bit 10 may be fabricated from material such as, for example, tungsten carbide, and includes a shaft 12 and a cutting area 14. Cutting area 14 includes a drill bit tip 16, cutting surfaces 18, and flutes 20.

One aspect of the present invention is directed to depositing a metal film which is phased into the surface of cutting area 14. The metal film is deposited as an integral part of the substrate atomic lattice with a uniform coverage and thickness by high energy deposition of atomic sized particles of the desired coating or lubricating material. The material film may comprise, for example, any of the softer materials, such as, for example, gold, silver, palladium, nickel, or titanium, having the properties of low friction, good adhesion, and low shear stress which may be deposited by high level ion plating in a thin film directly bonded to the surface of a material-working tool, such as for example, drill bit 10.

Figure 2:
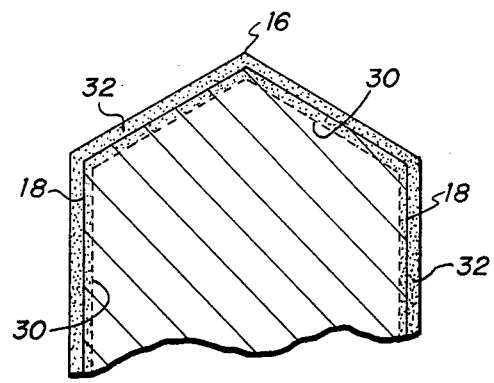
FIG. 2 is an enlarged sectional view taken generally along sectional lines A—A of FIG. 1 which has been lubricated in accordance with one aspect of the present invention.

Referring now to FIG. 2, an enlarged sectional view of cutting area 14 is illustrated showing the phased alloy build up of a thin protective film on cutting area 14. At the onset of a deposition, the initial ions arrive under an electrical charge acceleration and lodge into the substrate lattice structure 30 below the surface of cutting area 14. As the buildup continues, a thin film or layer 32 is deposited of lubricant material. Layer 32 of lubricant material is selected to exhibit chemical stability and/or resistance to alloying with or sticking to the surface of the material being cut. Such materials include solid solution type alloys that retain ductility and which exhibit corrosion resistance. One aspect of the present invention is the use of an alloy of silver and palladium having, for example, an 80 percent silver weight. An important aspect of the present invention is the use of lubricant materials that are softer than the material of the material-working tool to which they are bonded. Drill bit 10 may be fabricated from material such as, for example, tungsten carbide which is considerably harder than the material of layer 32. The thickness of layer 32 may be in the range of 10,000 to 12,000 angstroms.

Figure 3:
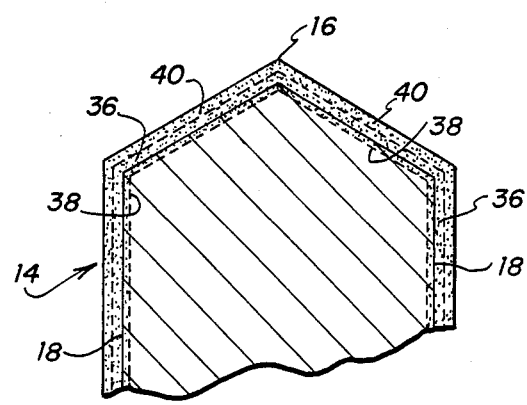
FIG. 3 is an enlarged sectional view taken generally along sectional lines A—A of FIG. 1 which has been lubricated in accordance with another aspect of the present invention.

FIG. 3 illustrates the use of multiple film layers in accordance with the present invention that offer decreasing hardness from the bulk hardness of the material-working tool itself to the outer surface of the coated tool. A first layer 36 is applied to cutting area 14 and extends into the substrate lattice structure 38. A second layer 40 is deposited over layer 36 and forms the outer coating for cutting area 14. Layer 40 corresponds to layer 32 previously described with respect to FIG. 2. Layer 36 comprises a material that is softer than the bulk hardness of drill bit 10 but yet harder than the hardness of the material of layer 40. Layer 36 may comprise, for example, material including nickel and titanium having a weight percentage of, for example, 71 percent titanium. The use of layer 36 allows lattice slip to take place first in the outer lubricant layer 40, next in layer 36 and finally in cutting area 14 itself should a portion of cutting area 14 become highly loaded with an instantaneous shearing load. Thus, the present coatings provide protection for cutting area 14 from both chemical as well as physical failure mechanisms. The present invention results in high adhesion of the lubricating films to the material-working tools.

The lubricating film layers in accordance with the present invention are applied by several different processes such as, for example, chemical vapor deposition, vacuum evaporation also referred to as physical vapor depositions, sputtering including radio frequency, direct current and various magnitron versions as well as ion plating. Such processes are described in U.S. Pat. Nos. Re. 30,401; 4,420,386; and 4,468,309 which descriptions, disclosures, and drawings are hereby incorporated by reference into the present specification.

Figure 4:
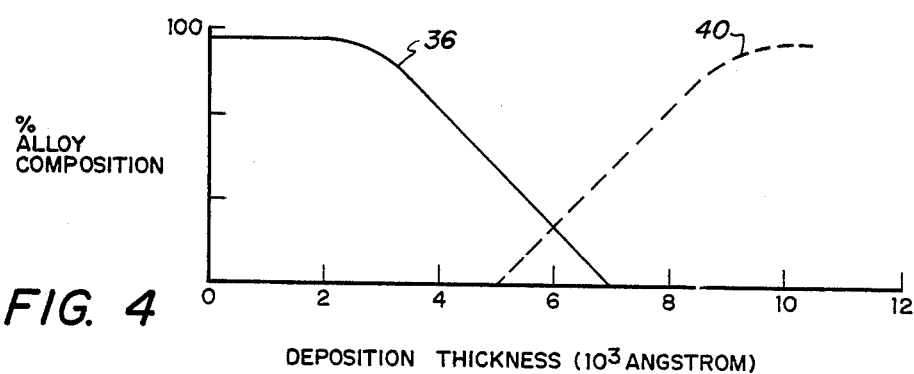
FIG. 4 is a graph illustrating how the composition of the lubricants of the present invention change with multiple coatings.

FIG. 4 illustrates a plot of percent alloy composition versus deposition thicknesses for lubricant film layers 36 and 40 (FIG. 3). As can be seen, there is an overlap between layers 36 and 40 of approximately 2,000 angstroms. The total coating thickness for cutting area 14 is approximately 10,000 to 12,000 angstroms.

Figure 5:
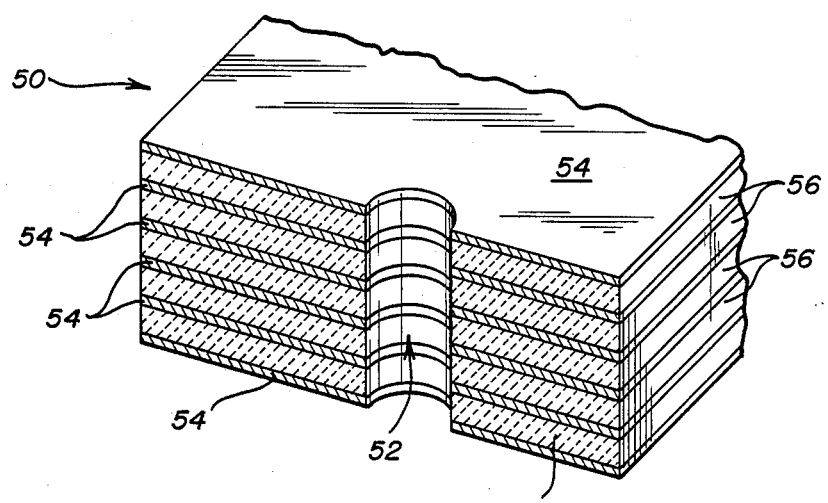
FIG. 5 is an illustration of a multi-layered printed circuit board having been worked by a material-working tool lubricated in accordance with the present invention.

FIG. 5 illustrates a multi-layered printed circuit board generally identified by the numeral 50 which illustrates a hole 52 formed by using drill bit 10 in accordance with the present invention. Printed circuit board 50 includes multi-layers of interdigitated conductors 54 and insulating material 56 such as, for example, G-10 printed circuit board material. Drill bits coated in accordance with the present invention result in drill bits having a low affinity for adhesion of the molten glass formed during a drilling operation of a printed circuit board 50 with much less smearing than is typical of previously developed tungsten carbide drill bits. Drill bits in accordance with the present invention also operate at lower temperatures than previously developed drill bits.

Figure 6:
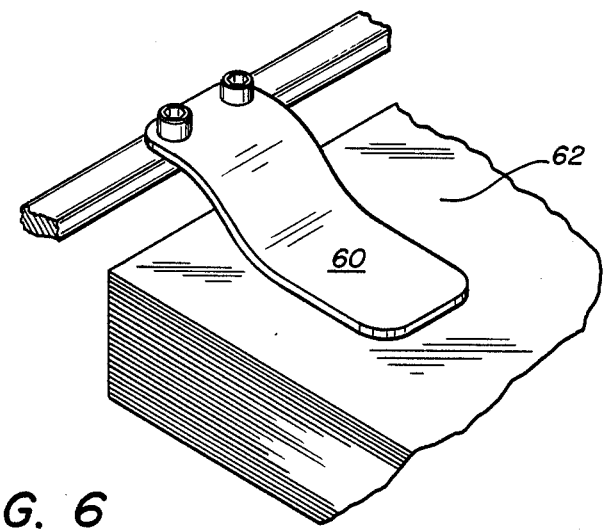
FIG. 6 illustrates the use of a material-working tool in the form of a paper guide lubricated in accordance with the present invention.

FIG. 6 illustrates another representative material-working tool in accordance with the present invention in the form of a finger or guide 60 used in a photocopy machine or high speed paper processing device for controlling the movement of paper 62. Finger 60 is lubricated in accordance with the present invention to allow finger 60 to control the movement of paper 62 without interfering with the motion of paper 62 and such that the paper 62 does not cause excessive wear of finger 60. Finger 60 may comprise a material containing a cobalt alloy and may be coated with lubricating films as previously described with respect to FIGS. 2 and 3.

Therefore, it can be seen that the present invention provides for a method of lubricating material-working tools in which lubricating film layers are deposited onto the material-working tool using high particulate energy level ion plating processes. The tools illustrated in the present application are for illustrative purposes only, and are not intended to limit the present invention.

Other tools, for example, dental drill bits, routers, and paper handling devices are also included within the present invention. The present lubricating films are characterized as being softer and the hardness of the tool to which they are applied.

Whereas the present invention has been described with respect to specific embodiments thereof, it will be understood that various changes and modifications will be suggested to one skilled in the art and it is intended to encompass such changes and modifications as fall within the scope of the appended claims.

I claim:

1. A method for lubricating a material-working tool comprising:

depositing a first material film layer of nickel-titanium material by high energy level vacuum plating onto the tool, the first material film layer having a hardness less than the hardness of the tool;

depositing a second material film layer selected from the group consisting of silver-palladium material and gold-palladium material by high energy level vacuum plating onto the first material film layer, the second plating onto the first material film layer, the second material film layer having a hardness less than the hardness of the first material film layer; and the first and second material film layers providing a thin mechanically insulating film and deposited to a total thickness of about 10,000 angstroms on the tool.

2. The method of claim 1 wherein said first and second material film layers are deposited by ion plating.

3. The method of claim 1 wherein said first and second material film layers are deposited by sputtering.

4. The method of claim 1 wherein said first and second material film layers are deposited by vacuum evaporation.

5. The method of claim 1 wherein said first and second material film layers are deposited by chemical vapor deposition.

6. A material-working tool having a core material and an exterior surface comprising:

a first material film layer of nickel-titanium material deposited by high energy level vacuum plating onto the exterior surface of the tool, said first material film layer having a hardness less than the hardness of the tool core material;

a second material film layer selected from the group consisting of silver-palladium material and gold-palladium material by high energy level vacuum plating onto said first material film layer, said second material film layer having a hardness less than the hardness of said first material film layer; and said first and second material film layers deposited to about 10,000 angstroms in total thickness for providing a thin mechanically insulating film on the exterior surface of the tool.

7. A guide for paper handling, the guide having a core material and a surface for contacting paper comprising:

a first material film layer deposited on the surface of the guide by high energy level vacuum plating, said first material film layer having a hardness which is less than the hardness of the guide core material.

8. The guide of claim 7 and further including:

a second material film layer deposited on the surface of said first material film layer by high energy level vacuum plating, said second material film layer having a hardness which is less than the hardness of said first material film layer.

9. The guide of claim 7 wherein said first material film layer includes nickel-titanium material.

10. The guide of claim 8 wherein said second material film layer includes silver-palladium material.

11. The guide of claim 8 wherein said second material film layer includes gold-palladium material.

* * * * *